United States Patent
Beaujeu et al.

(10) Patent No.: US 10,197,975 B2
(45) Date of Patent: Feb. 5, 2019

(54) METHOD FOR CONFIGURING AND OPERATING SUN-PROTECTION EQUIPMENT IN A BUILDING

(71) Applicant: SOMFY SAS, Cluses (FR)

(72) Inventors: Thierry Beaujeu, Marignier (FR); Serge Neuman, Seynod (FR); Morgan Roux, Passy (FR); Eric Cheron, Taninges (FR)

(73) Assignee: SOMFY SAS, Cluses (FR)

( * ) Notice: Subject to any disclaimer, the term of this patent is extended or adjusted under 35 U.S.C. 154(b) by 713 days.

(21) Appl. No.: 14/356,655

(22) PCT Filed: Nov. 7, 2012

(86) PCT No.: PCT/EP2012/072042
§ 371 (c)(1),
(2) Date: May 7, 2014

(87) PCT Pub. No.: WO2013/068408
PCT Pub. Date: May 16, 2013

(65) Prior Publication Data
US 2014/0288715 A1    Sep. 25, 2014

(30) Foreign Application Priority Data

Nov. 7, 2011  (FR) ...................................... 11 60133
Apr. 12, 2012 (FR) ...................................... 12 53396

(51) Int. Cl.
*G05B 11/01* (2006.01)
*G05B 15/02* (2006.01)
(Continued)

(52) U.S. Cl.
CPC ................ *G05B 11/01* (2013.01); *E06B 9/68* (2013.01); *G05B 15/02* (2013.01); *G06F 17/50* (2013.01);
(Continued)

(58) Field of Classification Search
None
See application file for complete search history.

(56) References Cited

U.S. PATENT DOCUMENTS 4,457,296 A    7/1984 Klann
4,727,918 A *  3/1988 Schroeder ................ E06B 9/32
                                                  160/168.1 R
(Continued)

FOREIGN PATENT DOCUMENTS

CN    1667206 A    9/2005
CN    1987695 A    6/2007
(Continued)

OTHER PUBLICATIONS

Chinese Office Action dated Jul. 4, 2016 in corresponding Chinese application No. 201280064206; with English translation (11 pages) (U.S. Pat. No. 4,457,296, US20060207730, EP2357544A2 cited in the Chinese Office Action, and US2010071856 corresponding to CN102224316 cited in the Chinese Office Action are not listed in this IDS since they were already listed in the IDS filed on May 7, 2014).

(Continued)

*Primary Examiner* — Charles E Anya
(74) *Attorney, Agent, or Firm* — Westerman, Hattori, Daniels & Adrian, LLP

(57) ABSTRACT

A method for operating an installation for the automated control of the conditions in a building, the installation including a central control unit, electrical equipment items with which areas of the building are equipped and a unit for managing sensor(s) suitable for measuring an input physical quantity, includes modelling the building and the building areas, obtaining at least one first value of the input physical quantity measured by the sensor(s), iteratively determining values of at least one output physical quantity, as a function of at least one second value of the input physical quantity, (Continued)

of the model of the building and of the areas of the building, and using the determined values in order to control the electrical equipment items.

19 Claims, 3 Drawing Sheets

(51) Int. Cl.
  *G06F 17/50* (2006.01)
  *E06B 9/68* (2006.01)
(52) U.S. Cl.
  CPC .................. *E06B 2009/6818* (2013.01); *G05B 2219/163* (2013.01); *G05B 2219/25011* (2013.01); *G05B 2219/2642* (2013.01)

(56) References Cited

U.S. PATENT DOCUMENTS

| | | | |
|---|---|---|---|
| 6,064,949 A | 5/2000 | Werner et al. | |
| 7,417,397 B2 | 8/2008 | Berman et al. | |
| 7,941,245 B1* | 5/2011 | Popat | E06B 9/68 135/155 |
| 7,977,904 B2 | 7/2011 | Berman et al. | |
| 2002/0196376 A1 | 12/2002 | Symoen et al. | |
| 2004/0205450 A1 | 10/2004 | Hao et al. | |
| 2004/0225379 A1 | 11/2004 | Klasson et al. | |
| 2005/0131554 A1 | 7/2005 | Bamberger et al. | |
| 2005/0203691 A1 | 9/2005 | Kim | |
| 2006/0000558 A1* | 1/2006 | Fennell | E06B 9/42 160/7 |
| 2006/0132072 A1 | 6/2006 | D'Ayot | |
| 2006/0207730 A1 | 9/2006 | Berman et al. | |
| 2009/0093916 A1 | 4/2009 | Parsonnet et al. | |
| 2009/0112366 A1 | 4/2009 | Jahn et al. | |
| 2009/0254222 A1 | 10/2009 | Berman et al. | |
| 2010/0071856 A1 | 3/2010 | Zaharchuk et al. | |
| 2010/0140365 A1 | 6/2010 | Kalore | |
| 2010/0146423 A1 | 6/2010 | Duchene et al. | |
| 2010/0262293 A1 | 10/2010 | Byberg et al. | |
| 2010/0288264 A1 | 11/2010 | Zhang | |
| 2010/0332034 A1 | 12/2010 | Bergeson et al. | |
| 2011/0184561 A1 | 6/2011 | Klasson et al. | |
| 2011/0220299 A1* | 9/2011 | Berman | E06B 9/322 160/5 |
| 2011/0251720 A1 | 10/2011 | Neuman | |
| 2012/0091804 A1* | 4/2012 | Altonen | E06B 9/68 307/31 |
| 2012/0125543 A1* | 5/2012 | Chambers | E05F 15/79 160/5 |
| 2012/0150788 A1* | 6/2012 | Berg-Sonne | G05B 15/02 706/48 |
| 2013/0113404 A1 | 5/2013 | Kalore | |

FOREIGN PATENT DOCUMENTS

| | | |
|---|---|---|
| CN | 1998270 A | 7/2007 |
| CN | 100430846 C | 11/2008 |
| CN | 101750979 A | 6/2010 |
| CN | 102112820 A | 6/2011 |
| CN | 102165132 A | 8/2011 |
| CN | 102193534 A | 9/2011 |
| CN | 102224316 A | 10/2011 |
| DE | 102005032550 A1 | 1/2007 |
| EP | 1274199 A2 | 1/2003 |
| EP | 1441269 A2 | 7/2004 |
| EP | 1441269 A3 | 10/2004 |
| EP | 2357544 A2 | 8/2011 |
| EP | 2357544 A3 | 8/2011 |
| JP | H10-72985 A | 3/1998 |
| JP | 2000-319462 A | 11/2000 |
| WO | 2008136663 A2 | 11/2008 |
| WO | 2008136663 A3 | 11/2008 |
| WO | 2009/056144 A2 | 5/2009 |
| WO | 2010/014908 A1 | 2/2010 |
| WO | 2010024966 A1 | 3/2010 |
| WO | 2010036350 A2 | 4/2010 |
| WO | 2010036350 A3 | 4/2010 |

OTHER PUBLICATIONS

Wang et al., "Simulation and Virtual Reality Representation of 3D Sunlight Analysis System", Forum Assays of the Second Engineering Construction Computer Application Innovation, Institute of Architectural Engineering Software, China Academy of Building Research, Beijing, China, 2009; with English translation (17 pages).
International Search Report, dated Jul. 9, 2013, issued in corresponding application No. PCT/EP2012/072042.
Final Office Action dated Oct. 23, 2017 in co-pending U.S. Appl. No. 14/356,016 (25 pages).
Chinese search report and office action dated Nov. 30, 2016 in co-pending Chinese application No. 201280054517; with English partial translation and partial machine translation (23 pages) (D5 DE102005032550 cited in the Chinese office action is not listed in this IDS form since it is already listed in an IDS form filed concurrently).
European search report and written opinion dated Jan. 18, 2013 in co-pending European application No. 12191646; with English partial translation and partial machine translation (15 pages) (D1 EP2357544 and D2 U.S. Pat. No. 4,457,296 cited in the European search report are not listed in this IDS since they were already listed in the IDS filed on May 7, 2014.
International search report dated Apr. 12, 2013 in co-pending U.S. Appl. No. 14/356,016; with English partial translation (5 pages).
International preliminary report on patentability dated May 13, 2014 in co-pending U.S. Appl. No. 14/356,016; with English partial translation (13 pages).
Neboutomation Software GmbH, "Neboutomation Software GmbH for your innovative and reliable building automation solution", product brochure, http://ww2.solar.dk/download/netxautomation_produktoverblik.pdf, May 7, 2010 (16 pages); in English; cited in ISR of co-pending U.S. Appl. No. 14/356,016.
Office Action dated Mar. 17, 2017 in co-pending U.S. Appl. No. 14/356,016; with PTO892; without returned SB08 (23 pages).
Office Action dated Apr. 5, 2018 co-pending U.S. Appl. No. 14/356,016 (24 pages).

\* cited by examiner

METHOD FOR CONFIGURING AND OPERATING SUN-PROTECTION EQUIPMENT IN A BUILDING

The invention relates to the field of buildings and more particularly buildings with so-called dynamic façades, comprising motorized solar protection screens, mobile and adjustable, and buildings provided with electrical equipment items for comfort and/or security that can be driven remotely.

The dynamic façades make it possible to ensure the light comfort in the building and produce energy savings by regulating the energy flows (heat input and natural ventilation) through the openings of the façade in combination with the driving of the heating, ventilation or lighting equipment items.

The screens can here be indoor blinds, for example venetian blinds with slats that can be oriented, or windable blinds, or external screens, orientable rigid panels, etc. A number of screens may be situated on one and the same opening.

Actuators drive the operation of the electrical equipment items, for example the rotational and/or translational movement of the mobile screens with which the openings are equipped, or the parameters of the lighting, heating or ventilation equipment items. The actuators are managed centrally at the level of the room, the floor, the façade to which they belong or simply at the building level. A control unit also recovers a certain number of indications from various sensors positioned inside and outside the building (presence, temperature, brightness sensors, time measuring devices, etc.).

Each actuator may equally be driven individually or in a group via a local control point. In particular, control areas on one and the same façade may be defined. Over each area as a whole, the actuators will be controlled simultaneously by the central control unit. An area may also correspond to all of a façade or even the building.

However, there is a need for finer control, notably window by window or equipment item by equipment item, to take account of local conditions, for example the shadows cast on the building, by another part of the building or by surrounding elements, like other buildings or geographic reliefs, or the circulation of the wind and rain in the presence of the building and its environment. Various solutions for managing cast shadows or for modelling the circulation of fluids exist. They generally entail a complex procedure for configuring the management device and cannot be added to existing installations. The invention therefore aims to provide solutions to the above mentioned problems.

In particular, the method for operating the installation according to the present invention offers greater flexibility and simplicity of use than the existing methods. Moreover, the installation may have low power computation means for managing cast shadows or, more generally, local conditions, which greatly reduce its cost. Moreover, the invention allows for satisfactory evolutivity.

The aim of the invention is to provide a method for operating an installation that remedies the drawbacks mentioned and improves the methods known from the prior art. In particular, the invention proposes a method for operating an installation that allows for a simple and economical management of the shadows cast, or more generally of the local conditions and of the ambient, surrounding and climatic parameters on an area of a façade or a building.

According to a first aspect, a method governs the operation of an installation for the automated control of the comfort and/or security conditions in a building, the installation comprising a central control unit, electrical equipment items with which areas of the building are equipped and a sensor management unit comprising at least one sensor suitable for measuring an input physical quantity. The method is characterized in that it comprises:
   a step of modelling the building and the areas of the building,
   a step of obtaining at least one first value of the input physical quantity measured by the at least one sensor, called measured value,
   a step of iteratively determining values of at least one output physical quantity, as a function of at least one second value of the input physical quantity, of the model of the building and of the areas of the building,
   a step of use of the determined values in order to control the electrical equipment items with which each area of the building is equipped.

The at least one second value of the input physical quantity may be the at least one first value and the iterative determination step may comprise a step of determining, notably by computation, values of the at least one output physical quantity, for at least two areas of the building.

The determination step may comprise a substep of pre-determining a reference data structure comprising values of the output physical quantities computed for a plurality of values of the input physical quantity, and a substep of selecting values of the output physical quantities in this reference data structure, as a function of the at least one first value.

The reference data structure may comprise, for each area, a predetermined set of associations between:
   representative predefined values of ranges of values of the input physical quantity; and
   representative predefined values of ranges of values of the output physical quantity;
the selection substep comprising
   a substep of determining a representative value of the first value, called input value;
   a substep of determining a predefined value of the output physical quantity, called output value, such that the association between input value and output value belongs to the predetermined set of associations of the reference data structure.

The substep of predetermining the reference data structure may be executed by a configuration device and the substep of selecting values of the output physical quantities may be executed by the central control unit and/or by the local control units.

The installation may also comprise at least one third sensor suitable for measuring the at least one output physical quantity in an area of a model of the building, the area of the model being an image of an area of the building. The model of the building may comprise an association of the location of the at least one third sensor with a location in an area of the building and the iterative determination step may comprise a step of measuring the values of the at least one output physical quantity in an area if the at least one third sensor is located in that area.

The installation may also comprise at least one second sensor suitable for measuring the at least one output physical quantity in an area of the building; the model of the building may comprise the location of the at least one second sensor relative to the areas of the building; the iterative determination step may comprise a step of measuring the values of the at least one output physical quantity in an area if the at least one second sensor is located in that area.

The usage step may consist in supplying the determined values to the central control unit and/or to local control units responsible for generating and/or sending commands to electrical equipment items with which each area of the building is equipped, notably in data stream form.

The usage step may comprise a step of selecting parameter values for the control of the electrical equipment items, in a second reference data structure comprising, for each area, a predetermined set of associations between
- predefined values of the output physical quantity; and
- predefined values of the parameters,
  - the selected values of the parameters being the predefined values associated in the second reference data structure with the determined values.

The usage step may comprise the supply of the determined values to the central control unit and/or to the local control units, in configuration file form.

The configuration file data may comprise binary data indicating or not indicating the presence of a shadow cast for a given opening or a given part of opening, at a given instant.

The configuration file may contain information relating to the shadow cast on parts of openings or on parts of areas.

The usage step may comprise:
i. a step of commanding a movement of each motorized solar protection screen of a first façade area as a function of a sun presence indication relating to the first façade area,
ii. a step of disabling the command of movement of the preceding step as a function of the configuration file data relating to each opening of the area.

The configuration file data may be supplied selectively over time at an input of an actuator, of an actuator group or of a local control means for one or more motorized screen manoeuvre actuators.

The disabling step depends on a sunshine level indication.

The iterative determination step may be executed by the sensor management unit.

The iterative determination step may be executed by the central control unit and/or by the local control units.

The iterative determination step may be executed by a configuration device.

The at least one input physical quantity and the at least one output physical quantity may be of the same type.

The first physical quantity and the second physical quantity may be of different types.

The input physical quantity may be the time; the output physical quantity may be the direct energy flux or the direct light flux received in each area.

The method may also comprise a step of virtual modelling of the structures surrounding the building and the iterative determination step may be performed also as a function of the result of this virtual modelling of the structures surrounding the building.

The modelling of the step may be a three-dimensional virtual modelling of the building, including the location of the façades and the positioning of the openings equipped with motorized solar protection screens on the façades.

A step of iteratively determining the shadows cast by the building on itself and/or by the surrounding structures also modelled as a function of time and for a given geographic location of the building may be performed for each façade and reiterated for each façade of the building for which a sun presence or direct energy flux or direct light flux indication is supplied.

The iterative determination step may take place by time increment over a complete calendar year.

The steps of modelling, obtaining, iteratively determining and using the determined values may be reiterated if a change occurs on the building or on its environment, necessitating an update of the configuration file.

Data medium, characterized in that it comprises a configuration file:
- obtained by implementing the method defined previously; or
- containing data and derived from a modelling of a building and of the openings on façades of the building, from an iterative determination of the shadow cast by the building on itself and/or by the surrounding structures also modelled as a function of time and for a given geographic location of the building, the data representing the presence or not of a shadow cast on each opening or each part of an opening equipped with a motorized solar protection screen as a function of time, or
- containing data determined by the step of iteratively determining values of at least one output physical quantity, as a function of at least one second value of the input physical quantity and of the model of the building,
- or in that it comprises a reference data structure.

An installation allows for the automated control of the comfort and/or security conditions in a building, the installation comprising a central control unit, electrical equipment items with which areas of the building are equipped and a sensor management unit comprising at least one sensor suitable for measuring an input physical quantity. The installation comprises hardware and/or software elements for implementing the method defined previously.

The hardware and/or software elements may comprise:
- an element for entering modelling data for the building and for the areas of the building or a data storage element for storing a modelling of the building and of the areas of the building,
- an element for iteratively determining values of at least one output physical quantity, as a function of at least one second value of the input physical quantity and of the model of the building,
- an element using determined values in order to control the electrical equipment items with which each area of the building is equipped.

According to a second aspect, a method governs the configuration of a solar protection installation in a building, the installation comprising a central control unit, motorized solar protection screens with which openings of the building are equipped. The method comprises:
i. a step of modelling the building and the openings on façades of the building,
ii. a step of iteratively determining shadows cast by the building on itself and/or by surrounding structures also modelled as a function of time and for a given geographic location of the building,
iii. a step of generating a configuration file comprising data representing the presence or not of a shadow cast on each opening equipped with a motorized solar protection screen as a function of time,
iv. a step of supplying the configuration file to the central control unit of the installation.

The modelling in the step i may be a three-dimensional virtual modelling of the building, including the location of the façades and the positioning of the openings equipped with motorized solar protection screens on the façades.

The method may comprise a step of three-dimensional virtual modelling of the structures and reliefs surrounding the building.

The configuration file data may be binary data indicating or not indicating the presence of a shadow cast for a given opening or a given part of opening, at a given instant.

The step ii may be performed for each façade and reiterated for each façade of the building for which a sun presence indication is supplied.

The iterative determination step ii may take place by time increment over an entire calendar year.

The steps ii, iii, iv may be reiterated if a change occurs on the building or on its environment necessitating an update of the configuration file.

The configuration file may contain the information relating to the shadow cast on a part of each opening.

A method governs the operation of an installation comprising a central control unit and motorized solar protection screens. The operating method comprises a step of use of the configuration file generated by using the configuration method defined previously to control the motorized screens, notably a step of using a configuration file generated by implementing the configuration method defined previously and comprising data representing the presence or not of shadows cast on each opening equipped with a motorized solar protection screen as a function of time. Alternatively, the operating method comprises:

a step of generating a configuration file comprising data representing the presence or not of a shadow cast on each opening equipped with a motorized solar protection screen as a function of time, notably a step of implementing the configuration method defined previously, and a step of using the configuration file.

The step of using the file may comprise:

v. a step of commanding a movement of each motorized solar protection screen of a first façade area as a function of a sun presence indication relating to the first façade area, vi. a step of disabling the command of movement of the preceding step as a function of the configuration file data relating to each opening of the area.

The disabling step may depend on a sunlight level indication.

The configuration file data may be supplied selectively over time at an input of an actuator, of an actuator group or of a local control means for one or more motorized screen manoeuvre actuators.

A data medium may comprise a configuration file:

obtained by implementing the method defined previously; and/or containing data and derived from a modelling of the building and of the openings on façades of the building, from an iterative determination of the shadow cast by the building on itself and/or by the surrounding structures also modelled as a function of time and for a given geographic location of the building, the data representing the presence or not of a shadow cast on each opening or each part of an opening equipped with a motorized solar protection screen as a function of time.

A solar protection installation in a building provided with openings, comprises a central control unit, motorized solar protection screens, the central control unit being suitable for supplying movement control commands for each motorized solar protection screen of a first façade area as a function of a sun presence indication relating to the first façade area and comprising a memory intended to store a configuration file comprising data relating to the presence or not of a shadow cast on each opening equipped with a motorized solar protection screen as a function of time. The installation also comprises an input corresponding to each motorized screen or each local control means driving one or more motorized screens and hardware and/or software means for disabling a movement command received by a motorized screen when the data supplied as input for a motorized screen indicates the presence of a shadow cast on the opening or the part of opening corresponding to this screen.

The invention will be better understood on reading the following description, given solely as an example and with reference to the attached drawings in which.

Generally, the method of automatically operating the installation takes account, for the control of the electrical equipment items EEi, notably of the electrical equipment items with which the openings of the building are equipped, of a modelling of the building and of its openings, and of the local conditions. These local conditions are estimated in different areas, that is to say, for example, in one or more rooms, at an opening, at a group of openings, or at a part of an opening.

The local conditions, such as the presence of cast shadows, temperature, the circulation of the wind or rain, the risks of frost, etc., are estimated from measurable physical quantities G associated with these conditions, by taking into account the influence exerted by the building and its environment in each area $Z_j$.

These measurable physical quantities G are, for example, the direct solar energy flux received through an opening or group of openings, the speed and direction of the wind on a façade, the temperatures outside and inside the building, etc.

The values of these measurable physical quantities are determined either by measurements made by the different sensors 13, 23 of the installation INST, or from measured values $V_m$ of the physical quantities and the models representative of the variations and/or corrections of these physical quantities in the presence of the building and its environment.

Hereinafter in this document, the physical quantities obtained from the sensors 13, 23 will be called input physical quantities F, and those determined from the measured values and the models of the building and its environment, output physical quantities G. Within the meaning of the invention, the chronological time is an input physical quantity F; a time measuring device is a sensor 13, 23.

Figure 1:
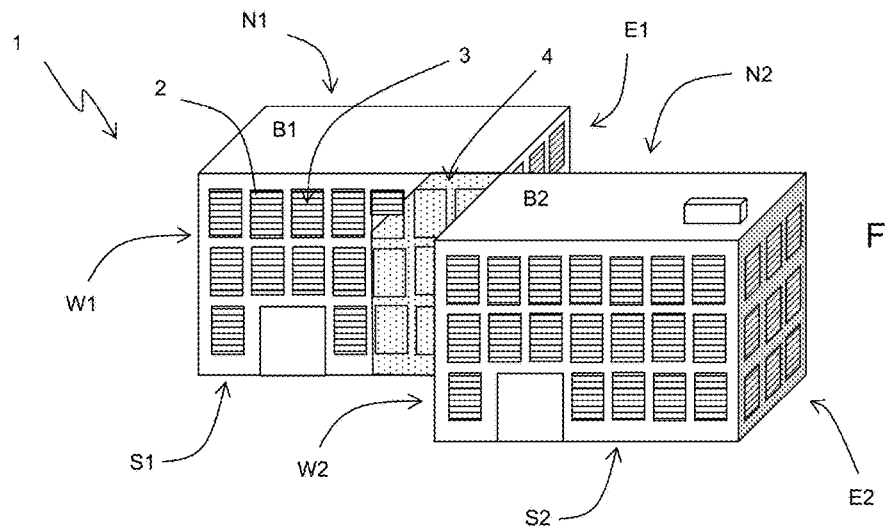
FIG. 1 represents a building in which an operating method according to the invention is implemented.

FIG. 1 represents a building 1, for example of tertiary type, in two parts B1 and B2, for office use for example. The two parts of the building comprise a plurality of openings 2 (notably windows) arranged on façades S1, S2, E1, E2, N1, N2, W1, W2 (these last four façades being concealed) facing south, east, north, west. The openings are equipped with motorized mobile screens 3, notably closure, black-out or solar protection screens, some of them being represented in the closed position by horizontal shading lines on the façades S1, S2, E1 and E2.

In order to optimize the comfort of the users and the energy efficiency of the installation INST, the control of the electrical equipment items manoeuvring the screens takes account of the presence of the shadows cast on each area Zj of the building.

A shadow cast on the façade S1 of the first part of the building by the second part of the building is represented by a shaded area 4. The rest of the visible façades are exposed to the sun, thus receiving a direct solar energy flux. The screens of the openings situated in the shadow area are raised, whereas the screens of the openings situated in the sun are lowered so as to follow the exposure specific to each opening, rather than by area predefined in advance on a central control unit.

Figure 2:
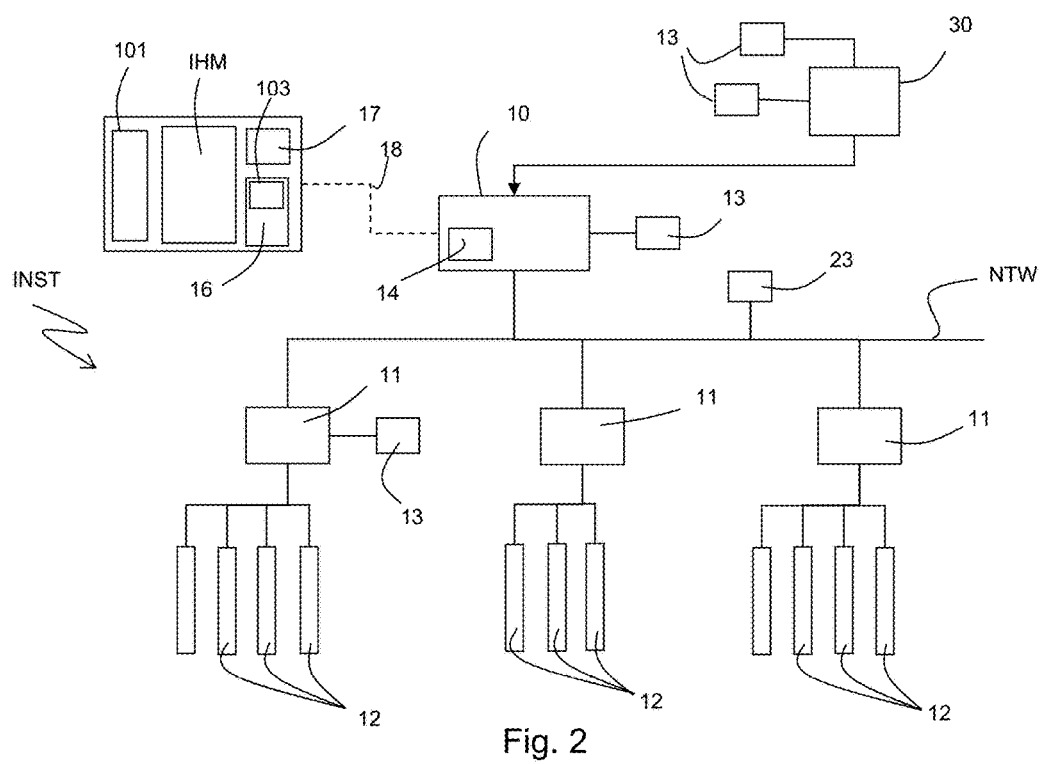
FIG. 2 represents a building automation installation in which an operating method according to the invention can be implemented.

An automated installation INST, represented in FIG. 2, allows for the dynamic management of the façades of the building.

The mobile solar protection screens are each driven by an actuator 12, the latter making it possible to open and close the screen automatically. The actuators are generally concealed in rails or box sections when they are installed and are then difficult to access from the inside or the outside of the building.

The automation of the installation of the building, notably of the screens via their actuators 12, based on the presence of a central control unit 10, of local control means 11 and of various sensors 13 (presence, brightness, temperature, etc.), makes it possible to manage in particular the comfort and temperature in the building. The sensors 13, 23 may be managed in certain embodiments by a sensor management unit 30. For this, the various equipment items EEi (actuators, control means, sensors) communicate with one another via wireless (radio in particular) or wired (wired bus, power line) networks NTW. An exemplary installation is represented in FIG. 2.

The term actuator used in this application notably comprises the electronic or electromechanical part making it possible to control the movement of the screen or control the state of a load, for example of a lamp, but also the electronic means for dialogue with the various other equipment items of the installation, notably the devices for sending and receiving communication frames exchanged between the various components of the installation according to known means.

Figure 3:
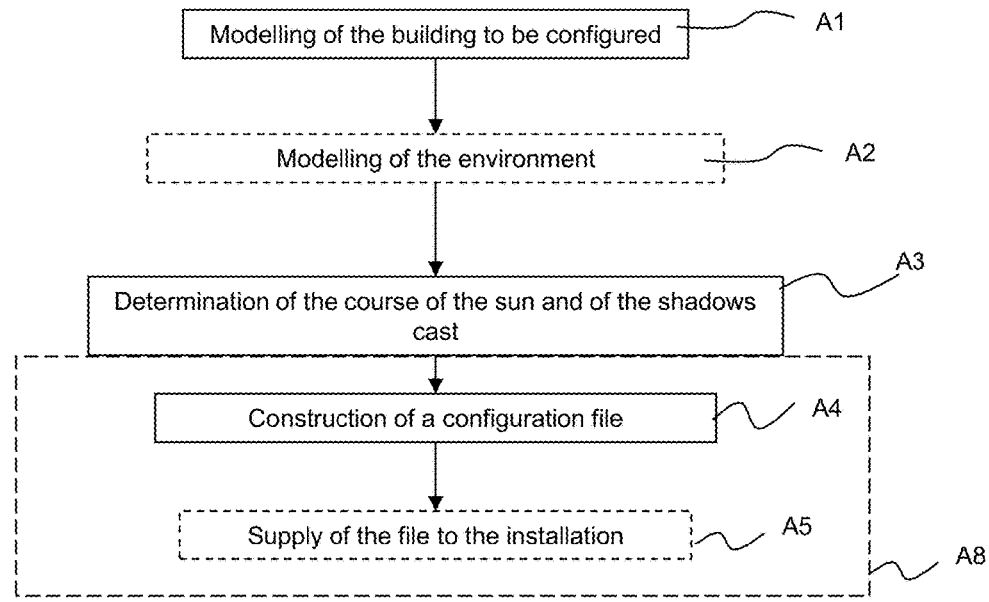
FIG. 3 represents a flow diagram of a first mode of execution of an operating method according to the invention.
Figure 4:
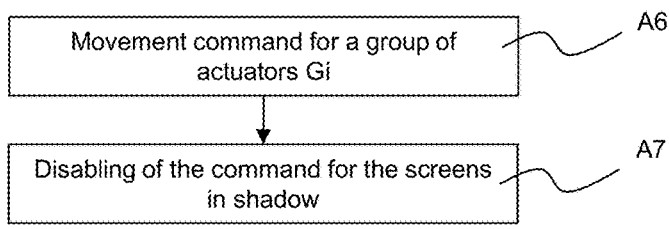
FIG. 4 represents optional steps of the first mode of execution of the operating method.

A first, simple embodiment of the operating method according to the invention makes it possible to control motorized screens as a function of the shadows cast on each area Zj of the building. In this embodiment, described below with reference to FIG. 3, one or more steps are implemented by a configuration device 15 comprising computing means, in particular an interface HMI (screen and means of interaction therewith, for example a keyboard, a mouse and/or a touch panel), computation means 16, such as a logic processing unit, and means 17 for receiving and transmitting information, for example via an Internet link. The configuration device 15 may be a computer, notably of PC type, a personal digital assistant or a tool specifically dedicated to the configuration of such an installation. It is connected to the installation directly or via one of the control means, by wire or wirelessly. This connection 18 is represented in the form of a dotted line, and it may be temporary.

During a step A1 of the operating method, a step of modelling the building is implemented, notably a modelling of the building in three dimensions and a modelling of the motorized solar protection screens on the different façades of the building. The modelling may comprise a graphic construction or a simple identification, for example an identification of the openings affected by the invention. The use of specific software dedicated to the virtual representation of a three-dimensional form is particularly suitable for this step. In particular, the real dimensions and the precise positioning of the openings intended to receive motorized screens, and of the areas Zj, must be observed during the step A1. Preferably, this modelling will rely on building construction drawings, even on a modelling supplied by the architect responsible for the construction of the building. Environment visualization tools (of geoportal or Google Earth™ type) will also be able to serve as a support for the modelling of the building concerned. During this step, data relating to the geometry of the building and data relating to the geographic orientation and to the geographic position of the building, are therefore input or retrieved.

During an optional step A2, the surrounding structures are also modelled and possibly inserted on the same graphical interface as the modelling of the automated building. The surrounding structures may be other buildings, geological or natural reliefs. In particular, in the case of natural reliefs, such as trees, a forecast trend of the future size of these reliefs may be incorporated in this step A2. During this step, data relating to the geometry of the surrounding structures and data relating to the positions of the surrounding structures in relation to the building, are therefore input or retrieved.

The modelling can be done in the form of a meshing of points or of objects.

In the two steps A1 and A2, it is also possible not to graphically model the building, but to supply the coordinates of the various points of the meshing to make it possible to determine the presence of sun, that is to say the presence of a direct solar energy flux, or the presence of shadows (direct solar energy flux below a predetermined threshold) for each point of the meshing of the building. As already mentioned, time is an input physical quantity within the meaning of the invention, which will be taken into account in the step A3 of determining the values VGj of at least one output physical quantity Go, in this example the direct solar energy flux, in each area Zj of the building.

Then, during a third step A3, the shadows cast on the building are determined, for example iteratively.

This notion of iterative determination concerns the collecting, for each area Zj and by time increments, data relating to all of the building.

The cast shadow may be, as explained previously, the shadow cast by the building on itself and/or by the surrounding structures, notably the structures modelled in the step A2. Alternatively, or complementarily, glare on the building, due to the surrounding structures, may also be modelled, the glare being dependent on the nature or the colour of the materials forming the surrounding structures, notably the façades of the surrounding structures.

The iterative determination is done by simulating the course of the sun over time, for example evaluating the trajectories of the light rays, and by taking into account the impact of the structures located on the trajectories of the simulated sun rays. This iterative determination is done for a given geographic location of the building (latitude, longitude and orientation of the façades), this information being supplied for example in the building modelling step A1. The iterative determination can be done graphically also with representation of the shadows cast on the building over time.

Preferentially, time increments are chosen for this step, for example a determination of the shadows cast every 15 minutes. The iterative determination takes place by time increments over an entire calendar year.

The preceding step makes it possible to generate a configuration file, comprising data representing the presence or not of a shadow cast on each opening equipped with a motorized solar protection screen as a function of time, during a computation step A4. The computation is implemented by the computation means of the configuration device 15, on the basis of software specifically implemented for this step. Advantageously, this embodiment, specific to a remote modelling, allows for the use in the installation INST of the control units 10, 11, having computation means limited to the control logics of the electrical equipment items EEi.

The software makes it possible in fact to add, to each area Zj represented, the determination of the values of the output physical quantity, in this example the direct solar energy flux, and therefore the presence or non-presence of a shadow cast over time and to store these data in the configuration file. For example, the file may comprise a matrix M comprising identifiers of the areas Zj in rows and the different dates of the year in columns. "Date" should be understood to mean being defined by a given hour of a given day of the year, for example 28 January 16:15 pm. By choosing a time pitch of 15 minutes, 24×4×365=35040 dates are obtained in a year of 365 days.

In this matrix, a given value, for example a "1", can be used to represent the presence of a shadow on a given date on a given opening. A given value, for example a "0" can be used to represent the absence of a shadow on a given date on a given opening. The presence of non-direct radiation, that is to say radiation reflected on an opening, may be determined by another value, for example "0.5". This value may also depend on the intensity of the reflected radiation. In this case, it is possible, when using the data, to set a threshold and consider each value to be equal to "1" if it is above this threshold or equal to "0" if it is below or equal to this threshold. The values can even be processed otherwise.

Finally, in a fifth step A5, the configuration file established in the preceding step is supplied to the central control unit UC 10 of the installation associated with the building which has been the subject of the configuration.

The configuration file comprising the matrix M contains all the values of the output physical quantity, for all the values that the input physical quantity can take, in this example the time over a complete calendar year, measured with a resolution of 15 minutes.

When using the data, a step A8 of obtaining the measured value Vm of the current time, makes it possible to determine the current date. The term "date" covers an indication distinguishing not only a day but also an hour (relating to a given time band) in that day. By reading, in the matrix M, the column corresponding to the current date, it is possible to determine, by reading the row j, the presence or not of a shadow cast, for each area Zj.

In this embodiment, the step A8 of obtaining the measured value Vm of the input physical quantity, the current time or the date, is executed after the step of determining A3 the values VGj of the output physical quantity G.

This value Vm is used to select, from all the values of the output physical quantity contained in the matrix M, the one which corresponds to the current time and to the area Zj.

According to a preferred embodiment, the modelling in the step A1 and/or step A2 is a graphical and/or virtual modelling in three dimensions of the building affected by the configuration and possibly of the surrounding building(s), including the location of the façades and the positioning of the openings equipped with motorized solar protection screens or of the reliefs surrounding the building concerned. This three-dimensional virtual representation makes it possible to visualize the presence of the shadows cast or the direct light flux at a given instant for the exact location of the building affected by the configuration, and to vary it by creating a virtual animation by a succession of images at different instants.

Alternatively, the graphical representation could also be in two dimensions, with a representation façade by façade and a reconstruction of the virtual building only by computation, with no graphical representation. The coordinates and exposures of the façades would then have to be clearly entered for the operating method to run correctly. The iterative determination of the step A3 would then be solely in computation form. The virtual representation of the building could be the subject of a visual animation only on each façade. The computation steps may be reiterated for each façade area or façade of the building for which a sun presence indication is supplied.

The configuration file, or modelling data, may be renewed for a building over time if a change occurs on the building (for example a modification of the structure or a change in the installation) or in its environment necessitating an update of the configuration file. Such is, for example, the case if a new building is constructed in proximity to the building concerned. Such is also the case if vegetation has grown in proximity to the building concerned. This maintenance is then simpler than for a first configuration if the original modelling data have been retained. In particular, the step of modelling the building may no longer be necessary, only the step of modelling the environment, notably a nearby building, then being implemented.

According to one embodiment of the invention, the configuration file data are binary data (1, 0) indicating or not indicating the presence of a shadow cast for a given opening at a given instant. These data may then be supplied in the form of a spreadsheet file, for example Excel, to the central control unit of the installation.

Once the configuration file is generated, the installation is ready to implement operation of the installation taking into account the presence of shadows cast, in particular with opening-by-opening management. The configuration file data may be used directly by the central control unit, notably by transmission to a specific input (for example an on/off or priority screen activated/screen deactivated input) linked to each actuator or each local control means driving one or more actuators. This embodiment is particularly simple when the configuration file data are binary data. Alternatively, the central control unit, if necessary, translates all or part of the configuration file to make it usable through an available and priority input linked with each actuator or each local control means driving one or more actuators.

In operation, when the installation receives a sun presence indication relating to the first façade area, it implements a step A6 for commanding a movement of each motorized solar protection screen of the first façade area to set the screens to the closed position. According to the method of the invention, a movement commanding step is also implemented to set the screens to the open position for the openings that are in the shade. This can be done by a disabling step A7 for disabling the movement command of the step A6 for one or more screens of this first façade area, that is to say that the command is not executed by the motorized screens concerned, if the indication from the configuration file corresponds to the presence of a shadow cast on this or these openings associated with this motorized screen or these motorized screens.

In this case, the motorized screens of the first façade area execute the control command, that is, notably, the screens are lowered to allow a regulation of the light inputs inside the building, apart from that or those for which a cast shadow is determined. It is possible to provide, in a reverse operation, for example in winter and in the absence of people in the building, the control command on detection of the presence of sun to be a command to raise the blinds, to benefit on the other hand from the heat inputs. The screen or screens affected by the presence of a cast shadow may thus remain in their initial configuration, for example they may be kept lowered. The movement command is then also disabled.

According to one embodiment of the invention, the configuration file data are supplied directly, notably when they are binary data, or indirectly (the data then being interpreted), selectively over time to an actuator input or an actuator group or a local control means for one or more motorized screen manoeuvre actuators. The actuator itself, or the local control means disables, case-by-case, the commands received by the central control unit.

According to an alternative embodiment, the central control unit processes the information from the configuration file and selectively sends control commands only for the attention of the screens that are the subject of sunlight. In both cases, the movement command associated with the sun presence indication on the first façade area is said to be disabled for the screens affected by the presence of cast shadows.

A new movement command is transmitted to the motorized screens if necessary, that is to say notably either because the sun is no longer present (the sun presence indication disappears) or because the file data indicate a modification, because of the time elapsed, concerning the presences of shadows cast on the different openings of the first façade area. The central control unit 11 therefore regularly checks the consistency between the sun presence indications and the presence of cast shadows. Preferentially, the configuration file is first established by taking into account the checking frequency applied by the central control unit.

The control of the motorized screens of the installation taking into account the presence of cast shadows is therefore independent of an advanced control of the position and of the angle of the sun in real time. A sunlight sensor supplying a sun presence or absence indication, or more generally a sunlight level indication, may be sufficient to allow for the precise control according to the invention.

On a finer level, it is possible to envisage having the configuration file supply information linked to parts of openings. Thus, intermediate positions in which the screens are to be set when only a part of the opening is covered by a shadow cast by the building or its environment could be determined. The command disabling would then concern a partial disabling, a movement being authorized over a part of the travel of a screen and blocked over another part.

Figure 5:
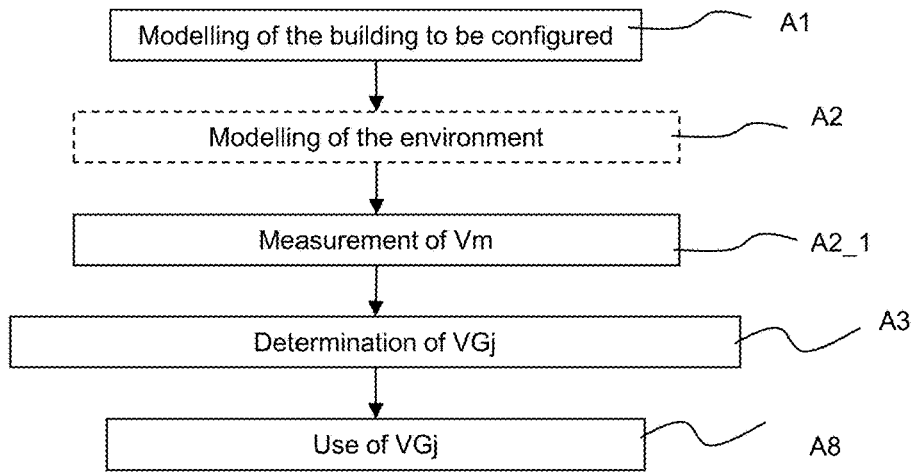
FIGS. 5 and 6 represent, in flow diagram form, a second, respectively a third, mode of execution of an operating method according to the invention.

A second embodiment of the operating method is described below with reference to FIG. 5. The steps A1, and possibly A2, of modelling the building and its environment, are similar to the steps A1 and A2 of the first embodiment.

To optimize the comfort and the energy efficiency of the building, the installation INST uses, in this embodiment, assessed values of a physical quantity, for example the light flux in each area Zj.

In this example, the output physical quantity is therefore a light flux. To determine it, two input physical quantities are taken into account: the current time, and the solar light flux measured by a sensor 13 of the installation. This sensor 13 may be a pyranometer or an albedometer, devices suitable for measuring the overall solar light flux, whether direct or reflected. The location of the sensor 13 is incorporated in the model of the building.

In the step A2_1, two values, Vm, Vm1, are measured for the above-mentioned two input physical quantities: the time, respectively the light flux received on the sensor 13.

Then, in the step A3, the values VGj of the light flux received in each area Zj are determined by computations, using the data obtained in the preceding steps.

The model of the building obtained in the step A1 comprises data relating to the geometry, to the orientation and to the geographic position of the building. It may also include data relating to the geometry and to the position of the surrounding structures, obtained in the optional step A2.

Based on the geographic location of the building and on the value Vm of the current time (day in the year and moment or time in the day) measured in the step A2_1, it is possible to compute the position of the sun. Then, the trajectories of the light rays are assessed. Finally, knowing the location of the sensor 13 on the building and the trajectories of the light rays, it is possible to determine the angle of incidence by which the measured solar light flux is received at the sensor 13.

Then, the data relating to the orientation and the position of each area Zj make it possible to determine the angle of incidence by which the solar light flux is received in the area Zj, by taking into account the impact of the structures located on the trajectories of the simulated rays of the sun. By combining this information with the measured value Vm1 of the light flux received by the sensor 13, it is possible to compute the value VGj of the light flux in each area Zj.

These values VGj constitute assessments of the values of the physical quantity Go in the areas Zj and can advantageously replace any values obtained from measurements made by the real sensors which would be placed in each area Zj; these determined values VGj are considered to be values from "virtual sensors". They are used in a step A8 as would the values from real sensors.

Duly determined values VGj are then supplied to the central control unit 10 and/or to the local control units 11 and are processed as measured values of the physical quantity G. These values are sent progressively, by simulating acquisitions performed over time by the "virtual sensors", in the areas Zj. In this way, the installation can provide an operation determined area by area, by taking into account local conditions, without the added cost of additional real sensors. Each area Zj thus receives a value which is specific to it instead of a centralized value.

The iterative determination step A3 may be executed by one of the control units 10, 11, or by the sensor management unit 30. In the latter case, the computation corresponding to the determination of the values VGj is the responsibility of the sensor management unit 30, making it possible, as in the embodiment previously described, to use, in the installation INST, control units 10, 11 having low power computation means.

It is important to note that, in this second embodiment, the step A2_1 of obtaining measured values Vm, Vm1 of the input physical quantities is executed prior to the step A3 of iteratively determining the values VGo1j of the output physical quantity G.

Advantageously, the method according to the invention allows for an updating of an installation INST by simply adding or updating a single device, notably, in this embodiment, the sensor management unit 30. In practice, the devices that are in place, the control units 10, 11, and the electrical equipment items EEi, are able to communicate via the network NTW, and thus obtain information from the sensors 13 and use this information to determine their operation.

In the known solutions, the information relating to the physical quantities being supplied only by the sensor or sensors 13, a fine control, area by area, can be obtained by adding real sensors 13 to the installation. This solution leads to a significant extra cost, an intervention on the site, to install, area by area, the new sensors 13, and the pairing or the establishing of the communication links between the added sensors and the existing equipment items in the installation INST. Through the application of the method proposed by the invention, the fine control of the electrical equipment items EEi, area by area, is obtained at low cost and requires only a simple intervention on site.

Figure 6:
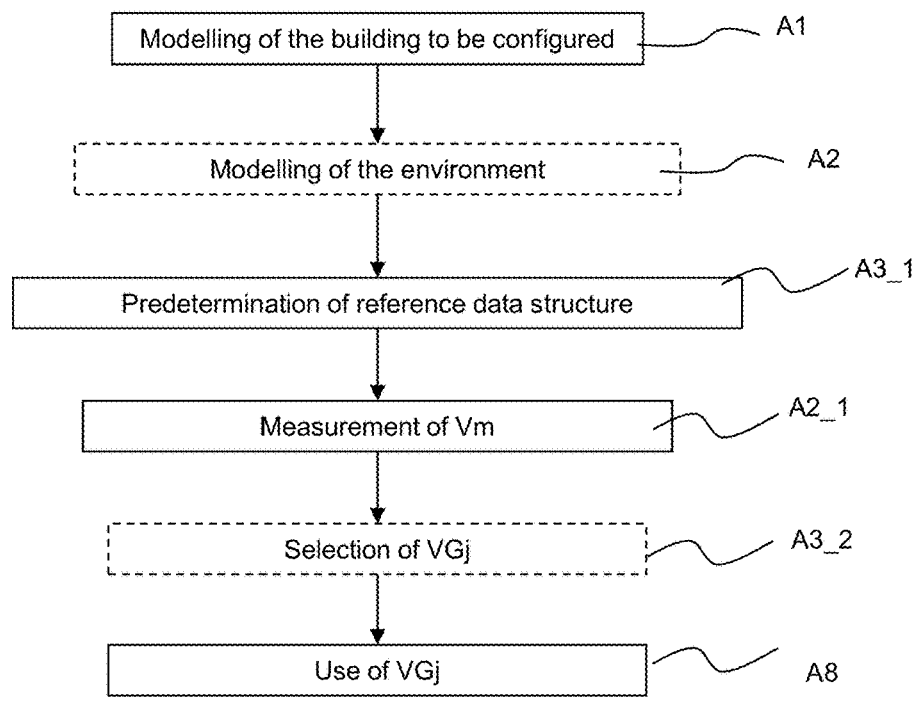

Another embodiment is represented in FIG. 6. This embodiment differs from the preceding embodiment in that the step A3 also comprises a substep A3_1 of predetermining a reference data structure DR and a substep A3_2 of selecting values VGj of the output physical quantities in this reference data structure DR.

This reference data structure consists of a predetermined set of associations, comprising values of the input physical quantities associated with values of the output physical quantity or quantities. The structure and the method of obtaining the associations are explained hereinbelow.

It is assumed that the installation takes account of m input physical quantities to determine the values of n output physical quantities.

An association belonging to the reference data structure DR consists of:
  m elements, each representing a value of one of the m input physical quantities; and
  n elements, each representing a value of one of the n output physical quantities.

The n values of the output physical quantities of an association are computed for each area Zj as a function
  of the m input physical quantities, and with the assumption that the values of the m input physical quantities are equal to the m elements representing them in the association concerned, and
  of the model of the building, possibly of the model of its environment, of the location of the area Zj in the building and by taking into account the influence of the building and its environment on the behaviour of the output physical quantities.

When constructing the reference data structure DR, the values to be taken into account for determining the output physical quantities are selected for each input physical quantity F.

If the input physical quantity is a quantity that can take continuous values (for example temperature, light flux, etc.), the range of possible values of the input physical quantity is divided into bands of values, and for each band k of values $(Vk\_min, Vk\_Max)$, a value $Vrk$, such that $Vk\_min <= Vrk <= Vk\_Max$, being chosen as value representative of the band k. It is considered that the value Vrk, representative of the band k, is representative for any measured value Vm, Vm1 of the input physical quantity belonging to the band k.

If the physical quantity F is a quantity that can take discrete values (for example presence/absence of a user), the values to be taken into account are chosen from the possible discrete values. All the discrete values are not necessarily chosen; some chosen values may be considered representative for a number of discrete values of the same input physical quantity.

Once the representative values to be taken into account for each of the m input physical quantities have been selected, the values of the n output physical quantities are computed for the different combinations of m values representative of the input physical quantities.

The reference data structure is preferably constructed in the predetermination substep A3_1 by a configuration device 15, thus allowing for remote modelling. It is important to note that the construction of this reference data structure DR can be performed prior to the operation of the installation. It can also be updated if changes occur on the models of the building or its environment.

In operation of the installation, in the step A8, m measured values are obtained, one for each of the m input physical quantities. Then, the m values representative of these measured values, called input values, are determined.

In this embodiment, the values of the n output physical quantities are obtained in the substep A3_2 of selection from the reference data structure DR. First, the association comprising the m input values is selected in the data structure DR. The n values of the output physical quantities are the n elements associated with the m input values in the selected association.

It is important to note that the reference data structure contains associations for each area Zj of the building, thus allowing for an iterative determination, area by area, of the values of the output physical quantities.

The computations take account of the model of the building and of its environment, as well as digital simulations of the behaviours of the n output physical quantities, in the presence of the building and as a function of the input physical quantity.

The steps A3_1 and A3_2 may be executed by two different devices, for example the configuration device 15, respectively the control unit 10, 11. Advantageously, this embodiment makes it possible to perform the predetermination step A3_1 remotely.

In some embodiments, the installation INST may also comprise at least one second sensor 23 suitable for measuring the output physical quantity G in an area Zk of the building 1, the model of the building incorporating the location of the second sensor or sensors 23 relative to the areas of the building.

The iterative determination step A3, illustrated by FIG. 6, may combine one of the methods previously described with steps of measuring the values of the output physical quantities. These measurement steps are performed in each area Zk if one or more second sensors 23 are located in that area Zk; otherwise, any one of the preceding methods may be used to determine the values VGj.

In another embodiment, a model of the building, to reduced scale and equipped with sensors 13, is produced and installed in conditions of geographic position and orientation similar to the conditions of the building. The model comprises areas zi placed in conditions similar to areas Zj of the building. Each area zi is equipped with real sensors 13 suitable for measuring the at least one input physical quantity F. In the step A3 of determining the values of the output physical quantities, a computation step is performed, by taking into account similarities in conditions of exposure of the areas of the model zi and Zj of the building, as well as the model of surrounding structures obtained in the step A2.

For example, if an area zi has the same exposure as one or more areas Zj of the building, the value Vm of the direct solar energy flux measured by a sensor 13 placed in the model is considered representative of a value VGj of the direct solar energy flux received in the area or areas Zj of the building having the same exposure. This determination method may be combined with the modelling of the structures surrounding the building. Thus, the value Vm of the direct solar energy flux measured by a sensor 13 placed on the model is considered representative of the value VGj of the energy flux received only in the absence of obstacles between the area Zj and the sun. Advantageously, this method makes it possible to have measurements performed in real time by the sensors 13 installed on the model, without having to modify the installation INST to install the sensors.

The invention relates also to a data medium, that is suitable for storing in particular a configuration file or a reference data structure. The configuration file may contain data and be derived from a modelling of the building 1 and of the openings on façades N1, N2, S1, S2, W1, W2, E1, E2 of the building, from an iterative determination of the shadow cast by the building on itself and/or by the surrounding structures also modelled as a function of time and for a given geographic location of the building, the data representing the presence or not of a shadow cast on each opening or each part of an opening equipped with a motorized solar protection screen as a function of time. The file may alternatively contain data determined by the step A3 of iteratively determining values VGj of at least one output physical quantity G, as a function of at least one second value Vf of the input physical quantity and of the model of the building 1.

An installation INST for the automated control of the comfort and/or security conditions in the building comprises the central control unit 10, the electrical equipment items EEi with which the areas Zj of the building are equipped, and the unit for managing sensors 30 comprising the at least one sensor 13 suitable for measuring the input physical quantity F. The installation comprises hardware and/or software elements 10; 11; 13; 15; 30 for implementing the method governing its operation.

The hardware and/or software elements may comprise:
an element 101 for entering modelling data for the building 1 and for the areas Zj of the building or a data storage element 101 for storing a modelling of the building 1 and of the areas Zj of the building,
an element 103 for iteratively determining values VGj of the at least one output physical quantity G, as a function of the at least one second value Vf of the input physical quantity and of the model of the building 1,
an element 10; 11 using the determined values VGj in order to control the electrical equipment items EEi with which each area (Zj) of the building is equipped.

The invention claimed is:
1. An automated control installation for controlling the comfort and/or security conditions in a building,
wherein the automated control installation comprises:
a central control unit, electrical equipment items with which areas (Zj) of the building are equipped, a sensor management unit comprising at least one sensor suitable for measuring an input physical quantity (F), and hardware and/or software elements configured for implementing a method for operating the automated control installation,
wherein the method comprises:
modelling the building and the areas (Zj) of the building, obtaining at least one first value (Vm) of the input physical quantity (F) measured by the at least one sensor, called measured value,
iteratively determining values (VGj) of at least one output physical quantity (G), as a function of at least one second value (Vf) of the input physical quantity (F), of the model of the building and of the areas (Zj) of the building, and
using the determined values (VGj) in order to control the electrical equipment items with which each area (Zj) of the building is equipped,
wherein the iterative determining comprises:
predetermining a reference data structure (DR) comprising values (VGj) of the output physical quantities computed for a predetermined plurality of values of the input physical quantity,
wherein the using the determined values comprises:
selecting values of the output physical quantities in the predetermined reference data structure (DR), as a function of the at least one first value (Vm),
and wherein the selecting comprises:
determining a representative value (Vrm) of the first value (Vm), called input value, and
determining a predefined value (VGm) of the output physical quantity (G), called output value, wherein the output value (VGm) is associated with the input value (Vrm) in the reference data structure (DR).

2. The automated control installation according to claim 1, wherein
the at least one second value (Vf) of the input physical quantity is the at least one first value (Vm); and
the iterative determining comprises determining values (VGj) of the at least one output physical quantity (G), for at least two areas (Zj) of the building.

3. The installation according to claim 2, wherein the values (VGj) of the at least one output physical quantity (G), for at least two areas (Zj) of the building are determined by computation.

4. The installation according to the claim 1,
wherein the reference data structure (DR) comprises, for each area (Zj), a predetermined set of associations ({Vrk, VGj}) between
representative predefined values (Vrk) of ranges of values of the input physical quantity (F); and
representative predefined values (VGj) of ranges of values of the output physical quantity (G);
and wherein the selecting comprises:
determining the representative value (Vrm) of the first value (Vm), called input value, among the representative predefined values (Vrk); and
determining the predefined value (VGm) of the output physical quantity (G), called the output value, among the representative predefined values (VGj), so that the association {Vrm, VGm} between input value and output value belongs to the predetermined set of associations of the reference data structure (DR).

5. The installation according to claim 1, wherein
the predetermining of the reference data structure (DR) is executed by a configuration device; and
the selecting of the values (VGj) of the output physical quantities is executed by the central control unit and/or by the local control units.

6. The installation according to claim 1, wherein
the installation also comprises at least one second sensor suitable for measuring the at least one output physical quantity (G) in an area (zj) of a model of the building, the area (zj) of the model being an image of an area (Zj) of the building;

the model of the building comprises an association of the location of the at least one second sensor with a location in an area (Zj) of the building; and the iterative determining comprises measuring the values (VGk) of the at least one output physical quantity (G) in an area (zj) if the at least one second sensor is located in that area.

7. The installation according to claim 1, wherein the installation also comprises at least one third sensor suitable for measuring the at least one output physical quantity (G) in an area (Zj) of the building;

the model of the building comprises the location of the at least one third sensor relative to the areas (Zj) of the building; and the iterative determining comprises measuring the values (VGk) of the at least one output physical quantity (G) in an area (Zj) of the building if the at least one third sensor is located in that area.

8. The installation according to claim 1, wherein the using comprises supplying the determined values (VGj) to the central control unit and/or to local control units responsible for generating and/or sending commands to electrical equipment items with which each area (Zj) of the building is equipped.

9. The installation according to claim 8, wherein the determined values (VGj) are supplied in data stream form.

10. The installation according to claim 1, wherein the using comprises selecting parameter values (Pj) for the control of the electrical equipment items, in a second reference data structure (DR2) comprising, for each area (Zj), a predetermined set of associations ({VGj, Pj}) between predefined values of the output physical quantity (VGj); and predefined values of the parameters (Pj), the selected values of the parameters being the predefined values associated in the second reference data structure (DR2) with the determined values (VGj).

11. The installation according to claim 1, wherein the using comprises supplying the determined values (VGj) to the central control unit and/or to the local control units, in configuration file form.

12. The installation according to claim 1, wherein the hardware and/or software elements comprise:

an element for entering modelling data for the building and for the areas (Zj) of the building or a data storage element for storing a modelling of the building and of the areas (Zj) of the building, an element for iteratively determining values (VGj) of at least one output physical quantity (G), as a function of at least one second value (Vf) of the input physical quantity and of the model of the building, and an element using determined values (VGj) in order to control the electrical equipment items with which each area (Zj) of the building is equipped.

13. The installation according to claim 1, wherein the electrical equipment comprises motorized solar protection screens, and wherein the using the determined values comprises using the determined values to control the motorized screens.

14. The installation according to claim 13, wherein the using of the file comprises:

i. commanding a movement of each motorized solar protection screen of a first facade area as a function of a sun presence indication relating to the first facade area, and ii. disabling the commanding of the movement as a function of the configuration file data relating to each opening of the area.

15. The installation according to claim 1, wherein the selecting comprises determining the predefined value (VGm) of the output physical quantity (G) belonging to the predetermined reference data structure as a representative value of the output physical quantity (G) for at least one area Zj.

16. A method of configuring a solar protection installation in a building, the installation comprising a central control unit, motorized solar protection screens with which openings of the building are equipped, the method comprising:

i. modelling the building and the openings on façades of the building, ii. iteratively determining shadows cast by the building on itself and/or by surrounding structures also modelled as a function of time and for a given geographic location of the building, iii. generating a configuration the comprising data representing the presence or not of a shadow cast on each opening equipped with a motorized solar protection screen as a function of time, and iv. supplying the configuration file to the central control unit of the installation, wherein the iterative determining comprises:

predetermining a reference data structure (DR) comprising values representing the presence or not of shadows computed for a predetermined plurality of values of time, wherein the predetermined reference data structure (DR) is adapted for selecting values representing the presence or not of shadows in the predetermined reference data structure (DR), as a function of the values of time, wherein the predetermined reference data structure (DR) includes predetermined associations between the values representing the presence or not shadows and the values of time, and wherein the selecting comprises:

determining a representative value (Vrm) of a first value (Vm), called input value, and determining a predefined value (VGm) of an output physical quantity (G), called output value, wherein the output value (VGm) is associated with the input value (Vrm) in the reference data structure (DR).

17. The configuration method according to claim 16, wherein the modelling is a three-dimensional virtual modelling of the building, including the location of the façades and the positioning of the openings equipped with motorized solar protection screens on the façades.

18. The configuration method according to claim 16, comprising modelling by three-dimensional virtual modelling the structures and reliefs surrounding the building.

19. Solar protection installation in a building provided with openings, the installation comprising:

a central control unit, motorized solar protection screens, the central control unit being suitable for supplying movement control commands for each motorized solar protection screen of a first facade area as a function of a sun presence indication relating to the first facade area and comprising a memory intended to store a configuration file comprising data relating to the presence or not of a shadow cast on each opening equipped with a motorized solar protection screen as a function of time, wherein the memory is a non-transitory data storage medium, and an input corresponding to each motorized screen or each local control means driving one or more motorized screens and hardware and/or software means for disabling a movement command received by a motorized screen when the data supplied as input for a motorized screen indicates the presence of a shadow cast on the opening or the part of opening corresponding to the screen, wherein the non-transitory data storage medium comprises a configuration file obtained by implementing a method of configuring a solar protection installation in a building, the installation comprising a central control unit, motorized solar protection screens with which openings of the building are equipped, the method comprising:

modelling the building and the openings on facades of the building, iteratively determining shadows cast by the building on itself and/or by surrounding structures also modelled as a function of time and for a given geographic location of the building, generating a configuration file comprising data representing the presence or not of a shadow cast on each opening equipped with a motorized solar protection screen as a function of time, and supplying the configuration file to the central control unit of the installation, wherein the iterative determining comprises:

predetermining a reference data structure (DR) comprising values representing the presence or not of shadows computed for a plurality of predetermined values of time, and selecting values representing the presence or not of shadows in the predetermined reference data structure (DR), as a function of values of time, wherein the predetermined reference data structure (DR) includes predetermined associations between the values representing the presence or not of shadows and the values of time, and wherein the selecting comprises:

determining a representative value (Vrm) of a first value (Vm), called input value, and determining a predefined value (VGm) of an output physical quantity (G), called output value, wherein the output value (VGm) is associated with the input value (Vrm) in the reference data structure (DR).

* * * * *

UNITED STATES PATENT AND TRADEMARK OFFICE
CERTIFICATE OF CORRECTION

PATENT NO. : 10,197,975 B2
APPLICATION NO. : 14/356655
DATED : February 5, 2019
INVENTOR(S) : Thierry Beaujeu et al.

Page 1 of 1

It is certified that error appears in the above-identified patent and that said Letters Patent is hereby corrected as shown below:

In the Specification

1) Change:
Column 18, Line 24:
iii. generating a configuration the comprising data representing
To be:
iii. generating a configuration file comprising data representing 2) Change
Column 18, Line 41:
values representing the presence or not shadows and the
To be:
values representing the presence or not of shadows and the Signed and Sealed this
Nineteenth Day of October, 2021

Drew Hirshfeld
*Performing the Functions and Duties of the
Under Secretary of Commerce for Intellectual Property and
Director of the United States Patent and Trademark Office*